(12) United States Patent
Lin et al.

(10) Patent No.: US 12,125,721 B2
(45) Date of Patent: Oct. 22, 2024

(54) PARALLELISM-ADJUSTABLE BONDING MACHINE

(71) Applicant: SKY TECH INC., Hsinchu (TW)

(72) Inventors: Jing-Cheng Lin, Hsinchu (TW);
Jung-Hua Chang, Hsinchu (TW);
Mao-Chan Chang, Hsinchu (TW)

(73) Assignee: SKY TECH INC., Hsinchu County (TW)

( * ) Notice: Subject to any disclaimer, the term of this patent is extended or adjusted under 35 U.S.C. 154(b) by 290 days.

(21) Appl. No.: 17/730,588

(22) Filed: Apr. 27, 2022

(65) Prior Publication Data
US 2023/0352323 A1 Nov. 2, 2023

(51) Int. Cl.
*H01L 21/67* (2006.01)
(52) U.S. Cl.
CPC .............................. *H01L 21/67132* (2013.01)
(58) Field of Classification Search
CPC ............ H01L 21/67132; H01L 21/67092
See application file for complete search history.

(56) References Cited

U.S. PATENT DOCUMENTS

| 2002/0083849 A1* | 7/2002 | Ohta | .................. H01L 21/67092 |
| | | | 100/92 |
| 2010/0308504 A1* | 12/2010 | Ness | ........................ B28B 7/38 |
| | | | 264/319 |
| 2014/0349118 A1* | 11/2014 | Izumi | ................ H01L 21/67126 |
| | | | 428/411.1 |

* cited by examiner

*Primary Examiner* — S. Behrooz Ghorishi
(74) *Attorney, Agent, or Firm* — Chun-Ming Shih; HDLS IPR SERVICES

(57) ABSTRACT

A parallelism-adjustable bonding machine includes a first chamber, a second chamber, a press-bonding unit, a carrier and plural parallelism-adjusting units. The first chamber is configured to connect to the second chamber, so as to define a closed space therebetween. The press-bonding unit is disposed within the first chamber, and the carrier is disposed within the second chamber. The press-bonding unit is disposed to face the carrier configured to press and bond substrates placed on the carrier. Each of the parallelism-adjusting units is disposed on the first chamber, and includes an adjustment shaft extending through the first chamber and connected to the press-bonding unit. The adjustment shaft includes an adjustment member located outside the first chamber and the closed space. A user is able to adjust a parallelism between the press-bonding unit and the carrier in an efficient and precise manner, from the adjustment member.

17 Claims, 4 Drawing Sheets

PARALLELISM-ADJUSTABLE BONDING MACHINE

TECHNICAL FIELD

This disclosure relates to a parallelism-adjustable bonding machine, which can be adapted to efficiently and precisely adjust a parallelism between a press-bonding unit and a carrier of the bonding machine.

BACKGROUND

As integral-circuit technology develops and comes to mature, electronic products become smaller, along with high performance, reliability and intelligence. Within those electronic products, microchips are significant for their performance. Thickness of microchips can also affect the performance of electronic product, for example, thin microchips can result in high thermal efficiency and electrical property, moreover with smaller sizes and lighter weights when being packaged and mounted onto the electronic product.

In common semiconductor manufacture, a back surface (lower surface) of a wafer is treated by thinning process, through-silicon via (TSV) process and backside metallization process. During the thinning process, if a thickness of the wafer is too smaller (less than or equal to 150 micrometers), the wafer itself may deform, bulge up, or even break apart, and thereby to result in chip failures and low yield rate.

Therefore, a bonding process is required to perform before thinning process. The bonding process is to dispose a bonding layer between the wafer and a supporter substrate (e.g. sapphire glass), then to compress and stack both of the wafer and the supporter substrate together by a press-bonding unit and a carrier, in order to bond them both together. After the thinning process, a de-bonding process is performed to separate the wafer and the substrate.

However, during the bonding process, if the press-bonding unit and the carrier are not parallel to each other, pressures applied to the wafer and the supporter substrate are unevenly distributed, and hence to from gas bubbles within the bonding layer between the wafer and the supporter substrate, and therefore to result in an undesirably wide total thickness variation (TTV) of the bonded wafer.

SUMMARY

To overcome the aforementioned drawback, this disclosure provides a parallelism-adjustable bonding machine, which can facilitate adjusting parallelism between the press-bonding unit and the carrier in an efficient and precise manner, for applying an evenly-distributed pressure on a first substrate and a second substrate placed between the press-bonding unit and the carrier, thereby to prevent gas bubbles from forming between the first substrate (e.g. wafer) and the second substrate (e.g. supporter substrate), during the bonding process.

Accordingly, one object of this disclosure is to provide a parallelism-adjustable bonding machine, which mainly includes a first chamber, a second chamber, press-bonding unit, a carrier, and a plurality of parallelism-adjusting units. Furthermore, the first chamber is configured to connect to the second chamber, so as to define a closed space between the first chamber and the second chamber.

Specifically, the press-bonding unit is connected to the first chamber, and the carrier is connected to the second chamber. The carrier includes a carrying surface configured to carry stacked substrates including a first substrate and a second substrate. The press-bonding unit is disposed to face the carrier, and configured to press and bond the first substrate and the second substrate on the carrier, so as to form a bonded substrate stack.

The parallelism-adjusting units extend through the first chamber. Each of the parallelism-adjusting units includes an end connected to the press-bonding unit, and another end exposed outside the first chamber and the closed space. With such configuration, a user may adjust the press-bonding unit from the another ends of the parallelism-adjusting units outside the closed space, in order to achieve a parallelism between the press-bonding unit and the carrier.

To be specific, the parallelism-adjustable bonding machine according to this disclosure can have the first chamber be connected to the second chamber to define the closed space, then allow to adjust the parallelism between the press-bonding unit and the carrier via the parallelism-adjusting units from the outside, for a more convenient operation. Also, before adjusting the press-bonding unit via the parallelism-adjusting units, air or gas within the closed space is extracted out to create an environment suitable for the bonding process, for achieving the parallelism of the press-bonding unit and the carrier in a more accurate and precise manner.

Accordingly, another object of this disclosure is to provide the aforementioned parallelism-adjustable bonding machine, wherein the each of the parallelism-adjusting units includes an adjustment shaft and a hanger shaft. Both of the adjustment shaft and the hanger shaft extend through the first chamber, and are connected to the press-bonding unit. The adjustment shaft is rotatable relative to the first chamber and the press-bonding unit, for leveling the press-bonding unit.

To be more specific, the adjustment shaft may include an adjustment member, a resilient member and a first connecting member. The first connecting member connects to the adjustment member via the resilient member. For example, the resilient member is a spring, and the first connecting member is a threaded shaft which is bolt-fastened into a bolt hole of the press-bonding unit. The adjustment member is exposed outside the first chamber. Such that, an user may turn the adjustment member to adjust a embedment length of the first connecting member relative to the press-bonding unit, and further to raise the press-bonding unit and compress the spring, or to lower the press-bonding unit and stretch the spring.

To achieve the aforementioned objects, this disclosure provides a parallelism-adjustable bonding machine, which includes: a first chamber; a second chamber; a press-bonding unit; a carrier; and a plurality of parallelism-adjusting units. The second chamber faces the first chamber, and the first chamber is configured to connect to the second chamber, so as to define a closed space between the first chamber and the second chamber. The press-bonding unit is connected to the first chamber. The carrier is connected to the second chamber, and includes a carrying surface facing the press-bonding unit, wherein the carrying surface is configured to carry stacked substrates including a first substrate and a second substrate. The parallelism-adjusting units are disposed on the first chamber, and each of the parallelism-adjusting units includes an adjustment shaft extending through the first chamber and connected to the press-bonding unit. The adjustment shaft is partially exposed outside the closed space and formed with an adjustment member on the first chamber.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
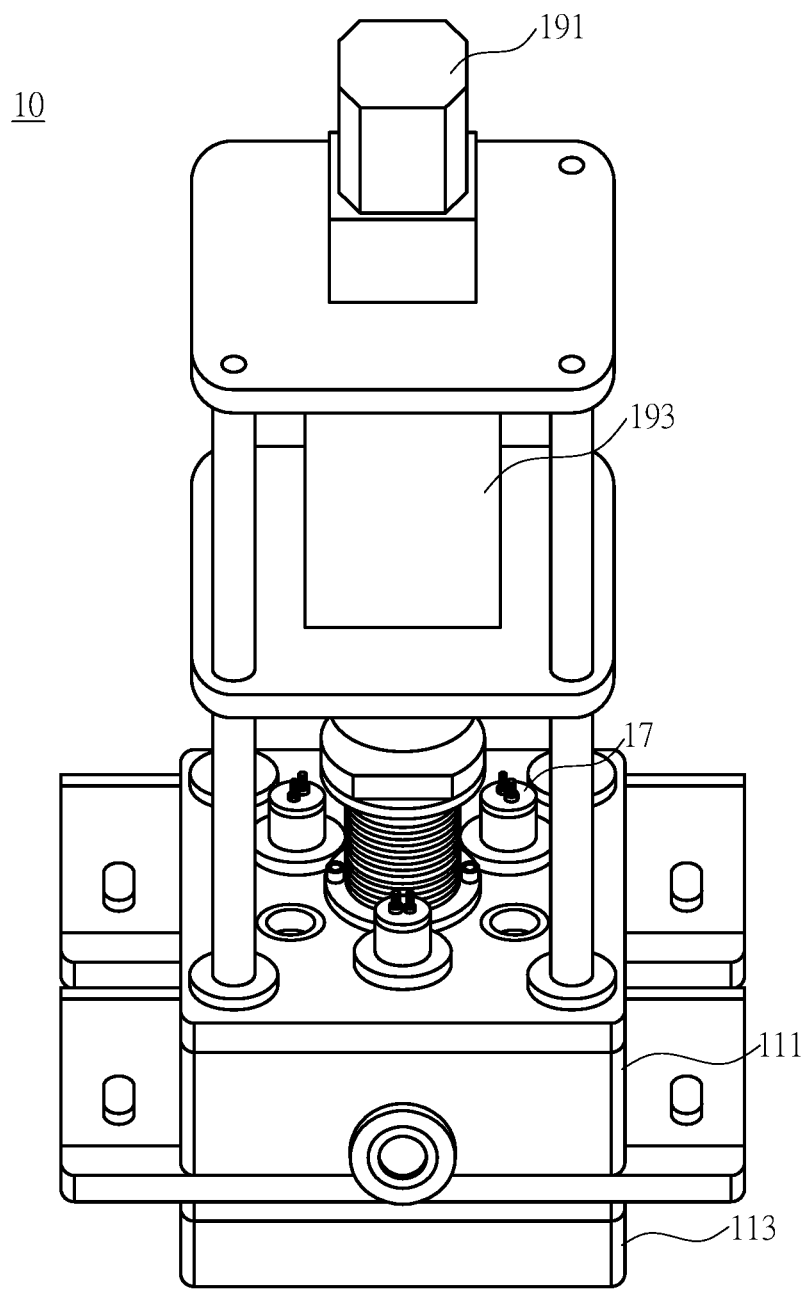
FIG. 1 is a perspective view illustrating a parallelism-adjustable bonding machine according to one embodiment of this disclosure.
Figure 2:
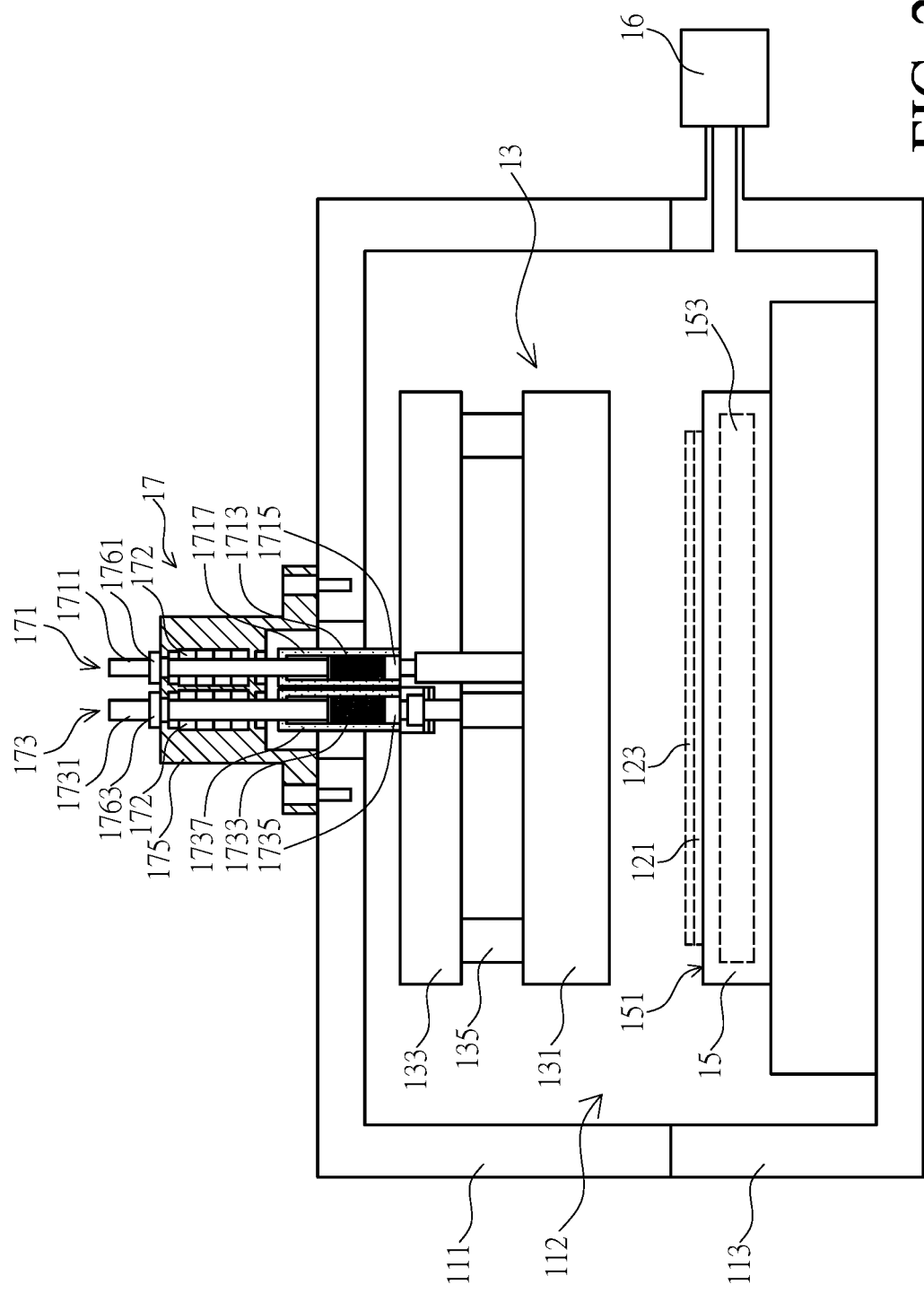
FIG. 2 is cross-sectional view illustrating the parallelism-adjustable bonding machine according to one embodiment of this disclosure.

FIG. 1 and FIG. 2 are a perspective view and a cross-sectional view illustrating a parallelism-adjustable bonding machine according to one embodiment of this disclosure. As shown in FIGS., the parallelism-adjustable bonding machine 10 includes a first chamber 111, a second chamber 113, a press-bonding unit 13, a carrier 15 and a plurality of parallelism-adjustable units 17. The first chamber 111 is disposed to face the second chamber 113, and is configured to move with respect to the second chamber 113.

As shown in FIG. 2, the press-bonding unit 13 is disposed within the first chamber 111, and connected to the first chamber 111. On the other side, the carrier 15 is disposed within the second chamber 113, and connected to the second chamber 113. The carrier 15 includes a carrying surface 151 facing the press-bonding unit 13. When the first chamber 111 moves to connect to the second chamber 113, the first chamber 111 and the second chamber 113 define a closed space 112 between the first chamber 111 and the second chamber 113, so as to contain the press-bonding unit 13 and the carrier 15 within the closed space 112.

In one embodiment of this disclosure, the first chamber 111 is connected to a chamber actuator 191, wherein the chamber actuator 191 is disposed outside the closed space 112 and is power-transmittably connected to the first chamber 111. The chamber actuator 191 is configured to drive the first chamber 111 to move related to the second chamber 113. For example, the chamber actuator 191 is a linear actuator.

In one embodiment of this disclosure, the first chamber 111 or the second chamber 113 is disposed with an air extracting pump 16. The air extracting pump 16 is fluidly connected to the closed space 112, and is configured to extract air or gas out of the closed space 112, so as to create a low pressure or vacuum condition within the closed space 112.

The carrying surface 151 of the carrier 15 is configured to carry stacked substrates including a first substrate 121 and a second substrate 123. For example, the first substrate 121 is a supporter, and the second substrate 123 is a wafer, wherein stacked substrates further include a bonding layer between the first substrate 121 and the second substrate 123, for adhering and bonding the first substrate 121 and the second substrate 123. In one embodiment, the carrier 15 may include a heater 153, configured to heat the first substrate 121 and the second substrate 123 on the carrying surface 151.

Figure 4:
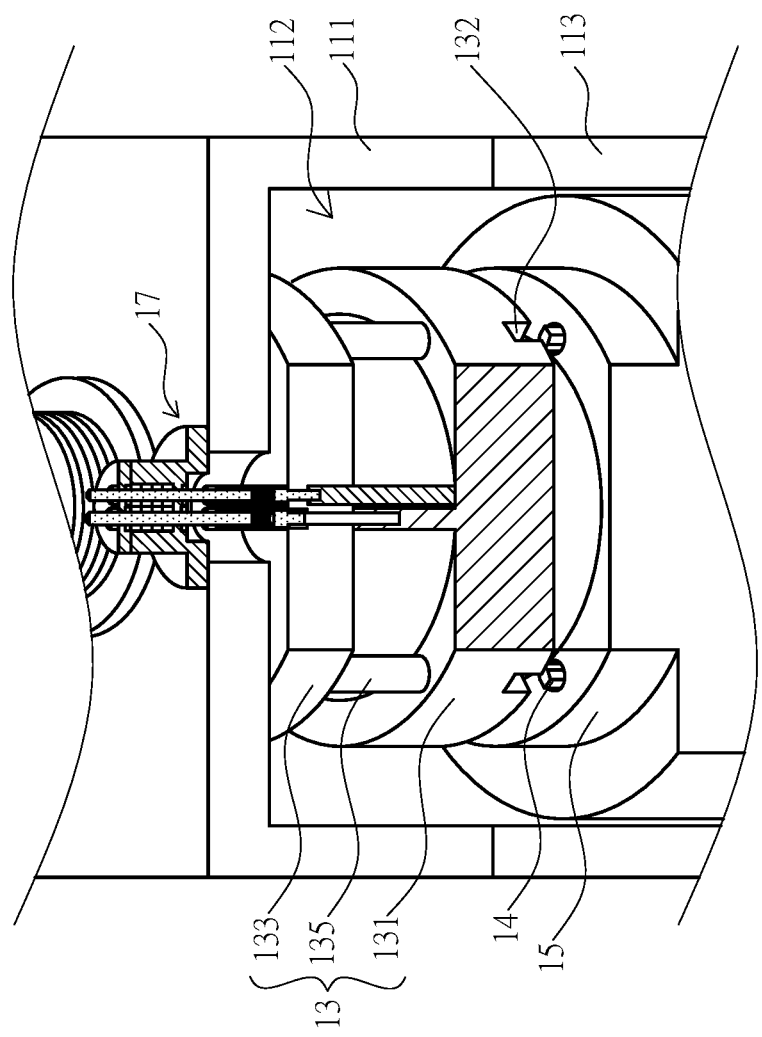
FIG. 4 is cross-sectional perspective view illustrating the parallelism-adjustable bonding machine according to one embodiment of this disclosure.

As shown in FIG. 4, in one embodiment of this disclosure, a plurality of aligning units 14 is disposed on the carrying surface 151 of the carrier 15. The aligning units 14 are operable to move towards or away from the stacked first substrate 121 and second substrate 123 on the carrier 15, so as to align the second substrate 123 with the first substrate 121. In one embodiment of this disclosure, the press-bonding unit 13 is formed with a plurality of receiving grooves 132 respectively corresponding to the aligning units 14. When the press-bonding unit 13 moves towards the carrier 15 to press the stacked first substrate 121 and second substrate 123 thereon, the aligning units 14 respectively enter and are received by the receiving grooves 132.

As shown in FIG. 1 and FIG. 2, a press-bonding unit actuator 193 is disposed outside the closed space 112 and connected to the press-bonding unit 13. For example, the press-bonding unit actuator 193 is a linear actuator. After aligning the first substrate 121 with the second substrate 123, the press-bonding unit actuator 193 drives the press-bonding unit 13 to move towards the carrying surface 151 of the carrier 15, and then to press the first substrate 121 and the second substrate 123 stacked on the carrier 15, in order to bond the two substrates 121, 123 together.

In one embodiment of this disclosure, the press-bonding unit 13 includes a pressing plate 131, a connecting plate 133 and a plurality of fixing shafts 135. The connecting plate 133 connects to the pressing plate 131 via the fixing shaft 135. The pressing plate 131 is disposed to face the carrying surface 151 of the carrier 15, and is configured to press and bond the stacked first substrate 121 and second substrate 123 placed on the carrier 15.

Moreover, a plurality of parallelism-adjusting units 17 are disposed on the first chamber 111. The parallelism-adjusting units 17 extend through the first chamber 111 and are connected to the press-bonding unit 13 within the closed space 112.

Each of the parallelism-adjusting units 17 includes an adjustment shaft 171. The adjustment shaft 171 extends through the first chamber 111, and is connected to the press-bonding unit 13.

In one embodiment, the adjustment shaft 171 includes an adjustment member 1711 and a first connecting member 1715. The adjustment member 1711 is disposed outside the first chamber 111 and the closed space 112, and the first connecting member 1715 is disposed within the closed space 112. The first connecting member 1715 is configured to connect to the press-bonding unit 13. For example, the connecting plate 133 of the press-bonding unit 13 is provided with a plurality of bolt holes, and the bolt holes are formed on a surface of the connecting plate 133 facing the first chamber 111. Each of the first connecting members 1715 includes a screw bar screwed into one of the bolt holes of the connecting plate 133, and thereby, the first connecting members 1715 are connected to the connecting plate 133. A user may turn each of the adjustment shafts 171 from the exposed adjustment members 1711 thereof, along therewith; a corresponding connecting member 175 also turns related to the connecting plate 133 of the press-bonding unit 13, so as to change a embedment length of the connecting member 175, for leveling the press-bonding unit 13.

Figure 3:
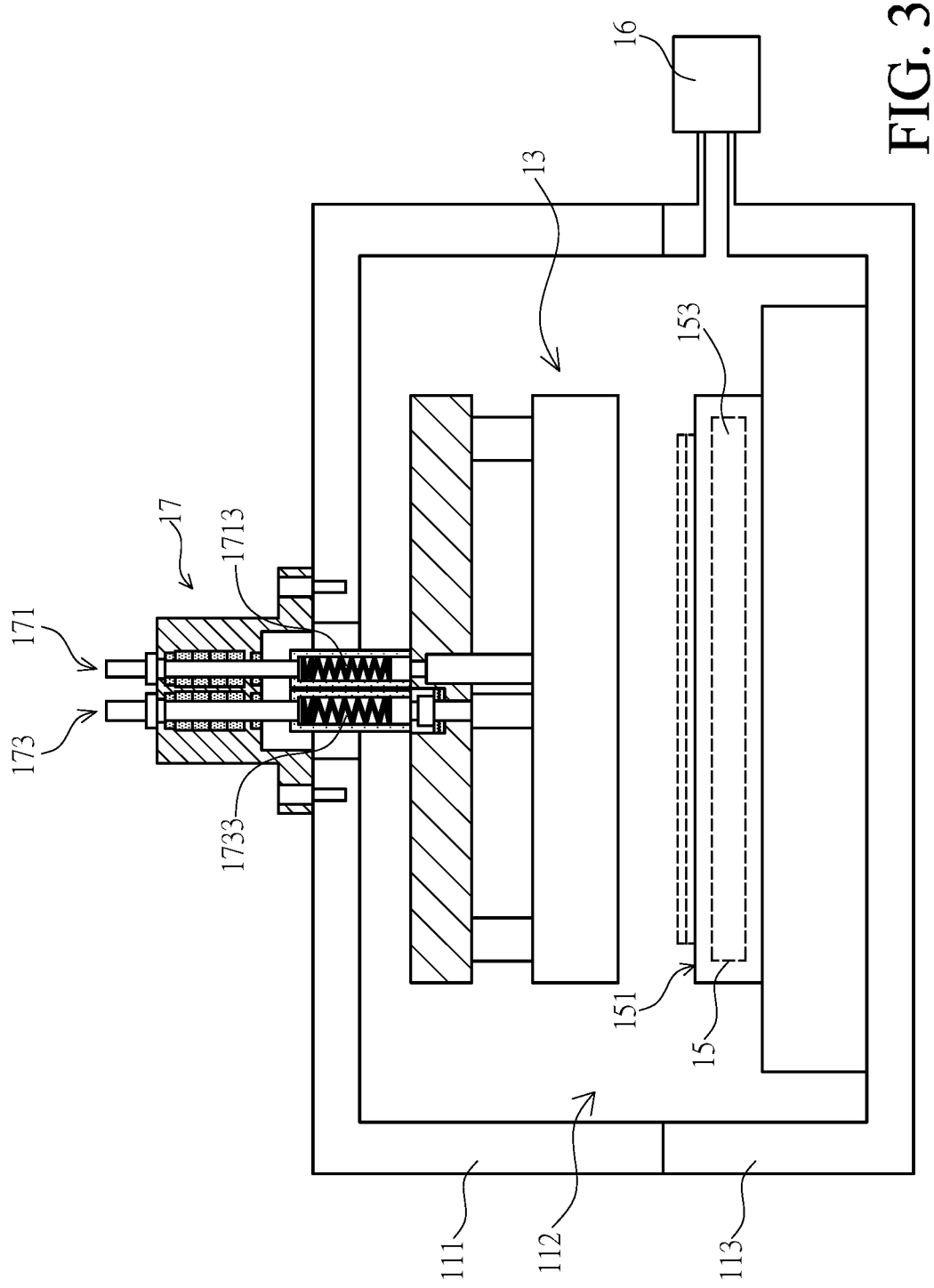
FIG. 3 is cross-sectional view illustrating a stretch state of a parallelism-adjusting unit of the parallelism-adjustable bonding machine according to one embodiment of this disclosure.

In one embodiment of this disclosure, the adjustment shaft 171 further includes a first resilient member 1713. The first connecting member 1715 is connected to the adjustment member 1711 via the first resilient member 1713. For example, the first resilient member 1713 is a spring. As shown in FIG. 2, when the embedment length in the bolt hole increases, the press-bonding unit 13 moves upward or moves towards the first chamber 111, so as to compress the first resilient member 1713. In an opposite manner as shown in FIG. 3, when the embedment length o in the bolt hole decreases, the press-bonding unit 13 moves downwards or moves away from the first chamber 111, so as to stretch the first resilient member 1713. In addition, the first resilient member 1713 is sleeved by a first sleeve member 1717. The first sleeve member 1717 includes an end connected to or fastened on the press-bonding unit 13, so as to move upwards or downwards along with the press-bonding unit 13.

In one embodiment of this disclosure, each of the parallelism-adjusting units 17 further includes a hanger shaft 173 extending through the first chamber 111 and connected to the press-bonding unit 13. The hanger shafts 173 includes a structure similar to that of the adjustment shaft 171, and the hanger shafts 173 includes a fixed member 1731 and a second connecting member 1735. The fixed member 1731 is disposed outside the first chamber 111 and the closed space 112, and the second connecting member 1735 is disposed inside of the closed space 112 to connect to the press-bonding unit 13. In addition, a second resilient member 1733 is disposed between the fixed member 1731 and the second connecting member 1735 of the hanger shaft 173. The second resilient member 1733 is sleeved by a second sleeve member 1737. The sleeve member 1737 includes an end connected to or fastened on the press-bonding unit 13.

As a user adjusts the parallelism of the press-bonding unit 13 via the adjustment shafts 171, the hanger shafts 173 also have the second resilient members 1733 thereof be compressed or stretched, and so as to have the second sleeve members 1737 move upwards or downwards along with the press-bonding unit 13. In one embodiment of this disclosure, the connecting ends 1735 of the hanger shafts 173 are fastened and fixed on the press-bonding unit 13, such that the hanger shafts 173 do not turn related to the press-bonding unit 13. However, in a different embodiment, the hanger shafts 173 may have the connecting ends 1735 connected to the press-bonding unit 13 in a rotatable manner.

Moreover, in one embodiment, each of the parallelism-adjusting units 17 includes a housing 175 connected to and fastened on the first chamber 111, for holding and positioning the adjustment shaft 171 and/or the hanger shaft 173. The adjustment shaft 171 and/or the hanger shaft 173 extend through the housing 175 to be fixed on the housing 175, and connect to the press-bonding unit 13. For example, each of the adjustment shaft 171 and/or the hanger shaft 173 is connected to the housing 175 via a shaft-seal unit 172 and/or at least one bearing, so as to allow the adjustment shaft 171 and/or the hanger shaft 173 to be rotatable relative to the housing 175 and the first chamber 111, and to maintain the low-pressure or vacuum condition of the closed space 112.

In practical use, it is able to operate the parallelism-adjusting units 17 on the first chamber 111, to adjust height levels corresponding to different sides of the press-bonding unit 13 which is connected to the parallelism-adjusting units 17, so as to ensure the parallelism between the press-bonding unit 13 and carrying surface 151 of the carrier 15.

Specifically, for each of the parallelism-adjusting units 17, the adjustment member 1711 of the adjustment shaft 171 and the fixed member 1731 of the hanger shaft 173 is fixed on the housing 175, respectively via a first fixing unit 1761 and a second fixing unit 1763. Fixed by the first fixing unit 1761 and the second fixing unit 1763, the adjustment shaft 171 and/or the hanger shaft 173 are unable to turn related to the housing 175 and/or the first chamber 111, so as to maintain the adjusted height levels and parallelism of the press-bonding unit 13 in a constant manner. To be specific, the fixing units 1761, 1763 are screw nuts, for example.

As aforementioned, before adjusting the parallelism of the press-bonding unit 13, the user may operate the chamber actuator 191 to drive the first chamber 111 to move towards the second chamber 113, to define the closed space 112 between the first chamber 111 and the second chamber 113. Thereafter, the air or gas within the closed space 112 is extracted out, via the air extracting pump 16.

Under the low-pressure or vacuum condition of the closed space 112, the first fixing unit 1761 is unfastened from the adjustment shaft 171 and/or the second fixing unit 1763 from the hanger shaft 173, then the adjustment shaft 171 is turned by the adjustment member 1711 thereof, so as to adjust the height levels of the press-bonding unit 13 for achieving the parallelism. Then once again, to fasten the first fixing unit 1761 back on the adjustment shaft 171 and/or the second fixing unit 1763 back on the hanger shaft 173, in order to secure, maintain the parallelism.

To be specific, the parallelism-adjustable bonding machine according to this disclosure, which is able to adjust the parallelism of the press-bonding unit 13 under an environmental condition quite similar to, or even same as that for bonding the first and second substrates 121, 123 by the press-bonding unit 13, as the low-pressure or vacuum condition. Thereby, it is able to adjust and achieve the parallelism between the press-bonding unit 13 and the carrying surface 151, in an efficient and precise manner.

The above disclosure is only the preferred embodiment of this disclosure, and not used for limiting the scope of this disclosure. All equivalent variations and modifications on the basis of shapes, structures, features and spirits described in claims of this disclosure should be included in the claims of this disclosure.

We claim:

1. A parallelism-adjustable bonding machine, comprising:
   a first chamber;
   a second chamber, disposed to face the first chamber, wherein the first chamber is configured to connect to the second chamber to define a closed space between the first chamber and the second chamber;
   a press-bonding unit, connected to the first chamber;
   a carrier, connected to the second chamber and including a carrying surface facing the press-bonding unit; wherein the carrying surface is configured to carry stacked substrates including a first substrate and a second substrate; and
   a plurality of parallelism-adjusting units, disposed on the first chamber; wherein each of the parallelism-adjusting units includes an adjustment shaft extending through the first chamber and connected to the press-bonding unit, and each of the adjustment shafts includes an adjustment member outside the first chamber and the closed space,
   wherein each of the parallelism-adjusting unit includes a hanger shaft connected to the press-bonding unit;
   wherein each of the parallelism-adjusting units comprises a housing connected to and fastened on the first chamber; and each of the adjustment shafts and the corresponding hanger shafts extend through the housing and the first chamber to be connected to the press-bonding unit;
   wherein each of the parallelism-adjusting units comprises a first fixing unit and a second fixing unit respectively disposed on the adjustment shaft and the hanger shaft to fix the adjustment shaft and the hanger shaft to the housing.

2. The parallelism-adjustable bonding machine according to claim 1, wherein each of the hanger shafts extends through the first chamber and includes a fixed member outside the closed space.

3. The parallelism-adjustable bonding machine according to claim 2, wherein each of the hanger shafts includes a connecting member having an end connected to the press-bonding unit.

4. The parallelism-adjustable bonding machine according to claim 3, wherein each of the hanger shafts includes a resilient member, and the connecting member includes another end connected to the resilient member.

5. The parallelism-adjustable bonding machine according to claim 4, further comprising a sleeve member, wherein the resilient member is sleeved by the sleeve member and the sleeve member includes an end connected to the press-bonding unit.

6. The parallelism-adjustable bonding machine according to claim 1, wherein each of the parallelism-adjusting units comprises a shaft-seal unit; and the adjustment shaft and the hanger shaft are connected to the housing respectively via the shaft-seal unit.

7. The parallelism-adjustable bonding machine according to claim 1, wherein each of the adjustment shafts includes a connecting member having an end connected to the press-bonding unit.

8. The parallelism-adjustable bonding machine according to claim 7, wherein each of the adjustment shafts includes a resilient member; and the connecting member includes another end connected to the adjustment member via the resilient member.

9. The parallelism-adjustable bonding machine according to claim 8, further comprising a sleeve member, wherein the resilient member of the adjustment shaft is sleeved by the sleeve member; and the sleeve member includes an end connected to the press-bonding unit.

10. The parallelism-adjustable bonding machine according to claim 1, further comprising a presser actuator connected to the press-bonding unit, for driving the press-bonding unit to move towards or away from the carrier, so as to press and bond the first substrate and the second substrate carried by the carrier.

11. The parallelism-adjustable bonding machine according to claim 10, further comprising a chamber actuator connected to the first chamber, for driving the first chamber to move towards or away from the second chamber, so as to connect the first chamber to the second chamber to define the closed space between the first chamber and the second chamber.

12. The parallelism-adjustable bonding machine according to claim 10, wherein the press-bonding unit comprises a pressing plate, a plurality of fixing shafts, and a connecting plate; the connecting plate is connected to the pressing plate via the fixing shafts; the connecting plate is connected to the presser unit actuator; and the pressing plate is configured to press the first substrate and the second substrate stacked on the carrier.

13. The parallelism-adjustable bonding machine according to claim 12, wherein each of the adjustment shafts comprises a connecting member configured to connect to the connecting plate.

14. The parallelism-adjustable bonding machine according to claim 1, wherein the carrier comprises a heater configured to heat the first substrate and the second substrate stacked on the carrying surface of the carrier.

15. The parallelism-adjustable bonding machine according to claim 1, further comprising an air extracting pump fluidly connected to the closed space, for extracting gas out of the closed space.

16. The parallelism-adjustable bonding machine according to claim 1, further comprising a plurality of aligning units disposed on the carrier, wherein the aligning units are configured to align the first substrate and the second substrate placed on the carrier.

17. The parallelism-adjustable bonding machine according to claim 16, wherein the press-bonding unit is formed with a plurality of receiving grooves for respectively containing the aligning units.

* * * * *